(12) United States Patent
Chang et al.

(10) Patent No.: US 8,721,845 B2
(45) Date of Patent: May 13, 2014

(54) COATED ARTICLE AND METHOD FOR MAKING SAME

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW);
Juan Zhang, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 126 days.

(21) Appl. No.: 13/207,990

(22) Filed: Aug. 11, 2011

(65) Prior Publication Data

US 2012/0141784 A1 Jun. 7, 2012

(30) Foreign Application Priority Data

Dec. 1, 2010 (CN) .......................... 2010 1 0568122

(51) Int. Cl.
*C23C 14/00* (2006.01)
*C23C 14/06* (2006.01)
*C23C 14/08* (2006.01)
*C23C 14/34* (2006.01)
*C23C 14/48* (2006.01)
*C23C 14/56* (2006.01)

(52) U.S. Cl.
CPC ........... *C23C 14/0676* (2013.01); *C23C 14/081* (2013.01); *C23C 14/34* (2013.01); *C23C 14/3457* (2013.01); *C23C 14/3464* (2013.01); *C23C 14/48* (2013.01); *C23C 14/56* (2013.01)
USPC ............... 204/192.1; 204/192.15; 204/192.16

(58) Field of Classification Search
CPC .. C23C 14/0676; C23C 14/081; C23C 14/34; C23C 14/345; C23C 14/3457; C23C 14/3464; C23C 14/48; C23C 14/56
USPC .............................. 204/192.1, 192.15, 192.16
See application file for complete search history.

(56) References Cited

FOREIGN PATENT DOCUMENTS

JP 06-061335 * 3/1994

OTHER PUBLICATIONS

Araiza et al "Optical, structural and electrical characteristics of aluminum oxynitride thin films depostited inan AR-N gas mixtrue RF sputtering system" Journ. of Mat'l Sci: mat'ls in Elec. 16 (2005) p. 657-661.*
von_Richfhofen et al "Metastable single-phase polycrystalline aluminium oxynitride films grwon by MSIP: construction and structure" Thin Solif Films 283 (1996) p. 37-44.*

* cited by examiner

*Primary Examiner* — Archene Turner
(74) *Attorney, Agent, or Firm* — Novak Druce Connolly Bove + Quigg LLP

(57) ABSTRACT

A coated article is provided. The coated article comprises a substrate having a first anti-fingerprint layer, and a second anti-fingerprint layer formed thereon and in that order. The first anti-fingerprint layer is an aluminum oxide layer. The second anti-fingerprint layer is an aluminum-oxygen-nitrogen compound layer implanted with one or more ion species selected from the group consisting of fluorine ion, boron ion, and nitrogen ion. A method for making the coated article is also described there.

8 Claims, 2 Drawing Sheets

COATED ARTICLE AND METHOD FOR MAKING SAME

BACKGROUND

1. Technical Field

The present disclosure relates to coated articles, particularly to a coated article having an anti-fingerprint property and a method for making the coated article.

2. Description of Related Art

Many electronic housings are coated with anti-fingerprint layers. These anti-fingerprint layers are usually painted on with a paint containing organic anti-fingerprint substances. However, the paint on anti-fingerprint layers usually bond weakly with metal substrates and therefore may not last very long. Furthermore, the paint may not be environmentally friendly.

Therefore, there is room for improvement within the art.

BRIEF DESCRIPTION OF THE FIGURES

Many aspects of the coated article can be better understood with reference to the following figures. The components in the figure are not necessarily drawn to scale, the emphasis instead being placed upon clearly illustrating the principles of the coated article.

DETAILED DESCRIPTION

Figure 1:
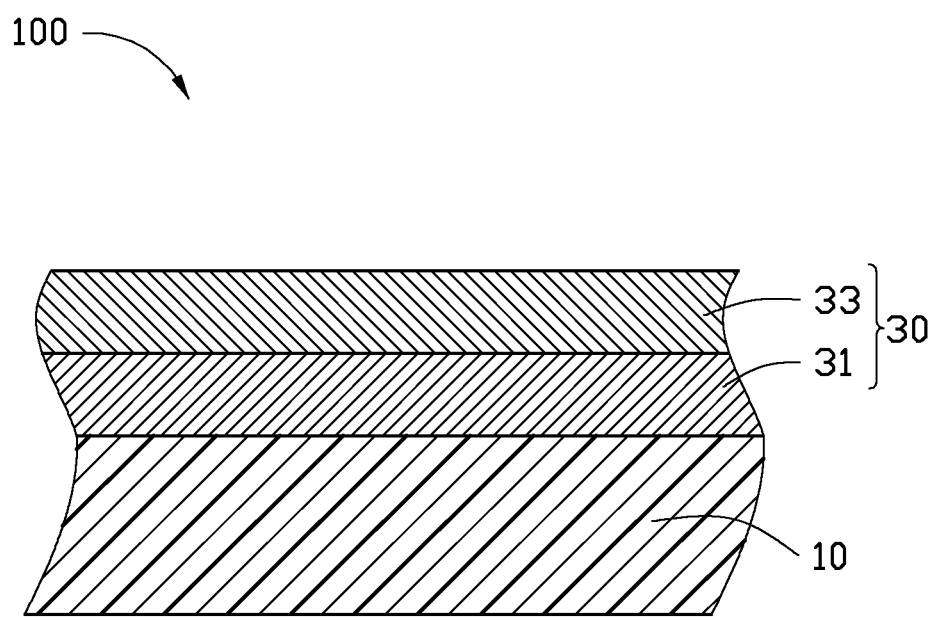
FIG. 1 is a cross-sectional view of an exemplary embodiment of a coated article.

FIG. 1 shows a coated article 100 according to an exemplary embodiment. The coated article 100 may be a housing for an electronic device. The coated article 100 includes a substrate 10, and an anti-fingerprint layer 30 formed on a surface of the substrate 10. The anti-fingerprint layer 30 includes a first anti-fingerprint layer 31 and a second anti-fingerprint layer 33.

The substrate 10 may be made of a metal or non-metal material. The metal material may be selected from the group consisting of stainless steel, aluminum, aluminum alloy, magnesium alloy, copper, copper alloy, and zinc. The non-metal material may be plastic, ceramic, or glass.

The first anti-fingerprint layer 31 is an aluminum oxide ($Al_2O_3$) layer. The first anti-fingerprint layer 31 is formed on the substrate 11 by vacuum sputtering deposition. The first anti-fingerprint layer 31 may be transparent and have a thickness of about 200 nm-300 nm.

The second anti-fingerprint layer 33 may be an aluminum-oxygen-nitrogen (Al—O—N) compound layer. The second anti-fingerprint layer 33 is implanted with one or more ion species selected from the group consisting of fluorine ion, boron ion, and nitrogen ion in a surface layer. The second anti-fingerprint layer 33 is formed on the first anti-fingerprint layer 31 by vacuum sputtering deposition. The second anti-fingerprint layer 33 may be transparent and have a thickness of about 200 nm-300 nm.

Figure 2:
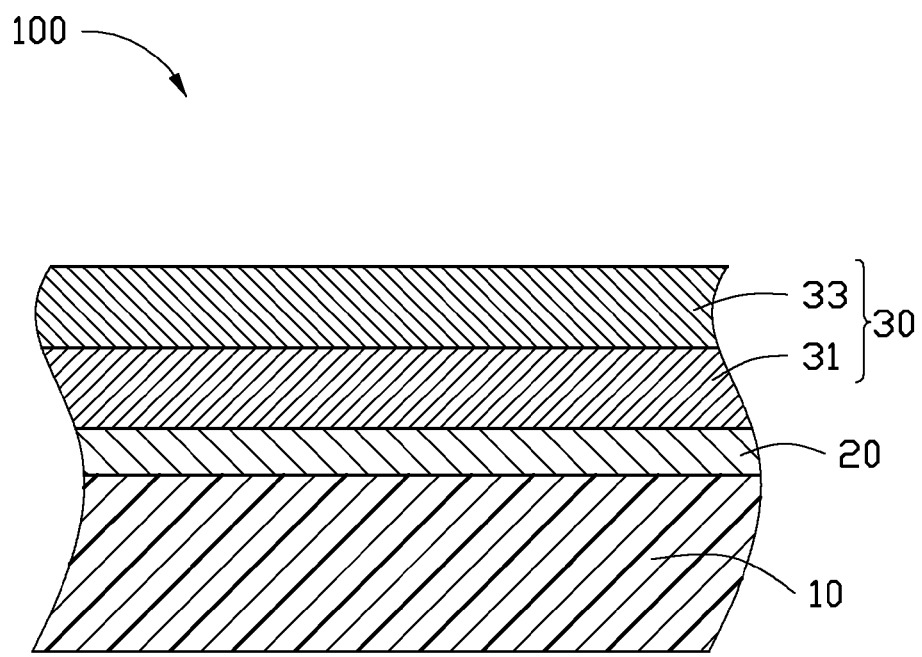
FIG. 2 is a cross-sectional view of another exemplary embodiment of a coated article.

Referring to FIG. 2, in a second embodiment, the coated article 100 may further include a decorative layer 20 located between the substrate 10 and the first anti-fingerprint layer 31, to provide decorative color or patterns for the coated article 100. The decorative layer 20 may be a metallic coating formed by vacuum sputtering deposition.

The first anti-fingerprint layer 31 comprising aluminum oxide and the second anti-fingerprint layer 33 comprising aluminum-oxygen-nitrogen compound both have a relatively low surface energy, so that the surface energy of the coated article 100 can be reduced. Furthermore, the implanted ion species selected from the group consisting of fluorine ion, boron ion, and nitrogen ion increase the entropy of the surface layer of the second anti-fingerprint layer 33, and increasing the disorderliness of the atoms in the surface layer of the second anti-fingerprint layer 33. As such, the surface energy of the second anti-fingerprint 33 is further reduced. Accordingly, the coated article 100 achieves a good anti-fingerprint property.

An exemplary method for making the coated article 100 may include the following steps:

The substrate 10 is provided.

The substrate 10 is pretreated. The substrate 10 is cleaned with a solution (e.g., alcohol or acetone) in an ultrasonic cleaner, to remove impurities such as grease or dirt from the substrate 10. Then, the substrate 10 is dried.

The substrate 10 is plasma cleaned. The substrate 10 may be positioned in a vacuum chamber of a vacuum sputtering machine (not shown). The vacuum chamber is fixed with aluminum targets therein. The vacuum chamber is then evacuated to about $8.0 \times 10^{-3}$ Pa. Argon (Ar, having a purity of about 99.999%) is injected into the chamber at a flow rate of about 500 standard-state cubic centimeters per minute (sccm) to 800 sccm. A bias voltage of about −500 V to about −800 V is applied to the substrate 10. Ar is ionized to plasma. The plasma then strikes the surface of the substrate 10 to clean the surface of the substrate 10. Plasma cleaning the substrate 10 may take about 5 minutes (min) to 10 min. The plasma cleaning process enhances the bond between the substrate 10 and the anti-fingerprint layer 30. The aluminum targets are unaffected by the plasma cleaning process.

The first anti-fingerprint layer 31 is vacuum sputtered on the pretreated substrate 10. Vacuum sputtering of the first anti-fingerprint layer 31 is implemented in a vacuum chamber of the vacuum sputtering machine. The inside of the vacuum chamber is heated to maintain a temperature of about 50° C.-180° C. Ar and oxygen ($O_2$) are simultaneously fed into the chamber, with the Ar acting as a sputtering gas, and the $O_2$ acting as a reaction gas. The flow rate of the Ar is about 100 sccm to 300 sccm. The flow rate of the $O_2$ is about 100 sccm-300 sccm. A bias voltage of about −70 V to about −180 V may be applied to the substrate 10. About 2 kW-5 kW of power is applied to the aluminum targets fixed in the chamber, depositing the first anti-fingerprint layer 31 on the substrate 10. The deposition of the first anti-fingerprint layer 31 may take about 20 min-60 min. The power is a medium-frequency AC power in this exemplary embodiment.

Then, the second anti-fingerprint layer 33 is directly formed on the first anti-fingerprint layer 31 by vacuum sputtering. Sputtering of the anti-fingerprint layer 15 is implemented in the vacuum chamber of the vacuum sputtering machine. Ar, $O_2$, and nitrogen ($N_2$) are simultaneously fed into the chamber, with the Ar acting as a sputtering gas, and the $O_2$ and $N_2$ acting as reaction gases. The flow rate of the $N_2$ is about 50 sccm to 150 sccm. About 2 kW-5 kW of power is applied to the aluminum targets, depositing the second anti-fingerprint layer 33 on the first anti-fingerprint layer 31. Other parameters are the same as the deposition of the first anti-fingerprint layer 31. The deposition of the second anti-fingerprint layer 33 may take about 20 min-60 min.

After the deposition of the second anti-fingerprint layer 33 is finished, ion species selected from the group consisting of fluorine ion, boron ion, and nitrogen ion are implanted into a surface layer of the second anti-fingerprint layer 33 by ion implantation process. The implantation process can be implemented in the vacuum chamber of the vacuum sputtering machine. In an exemplary embodiment, the ion implantation process is performed by supplying a process gas into a plasma source attached to the vacuum sputtering machine. The plasma source dissociates the process gas into ions. The dissociated ions are accelerated to become ion beams and are implanted into the second anti-fingerprint layer 33. The implanted ions react with the atoms and molecules in the surface layer of the second anti-fingerprint layer 33 and retain in the surface layer. One or more process gas supplied into the plasma source may be selected from the group consisting of $CF_4$, $B_2H_6$, and $N_2$.

The ion implantation process may be performed under the following conditions. The vacuum chamber is evacuated to maintain an internal pressure of about $1\times10^{-4}$ Pa. The process gas supplied into the plasma source maintains a working atmosphere from about 0.1 Pa to about 0.5 Pa. A RF source power of about 30 thousand volts (kV) to about 100 kV is applied to dissociate the process gas to be ions. The ions are accelerated to form ion beams. The ion beams have an intensity of about 1 milliampere (mA) to about 5 mA. The density of the ions implanted in the second anti-fingerprint layer 33 may be from about $1\times10^{16}$ ions per square centimeter (ions/$cm^2$) to about $1\times10^{18}$ ions/$cm^2$. The vacuum chamber may be maintained at a normal room temperature.

The method for making the coated article 100 may further include forming the decorative layer 20 on the substrate 10 by vacuum sputtering deposition, before forming the first anti-fingerprint layer 31.

The anti-fingerprint property of the anti-fingerprint layer 30 has been tested by using a dyne test pen (brand: ACCU; place of production: U.S.A.). The test indicates that the surface tension of the anti-fingerprint layer 30 is below 30 dynes, thus, the anti-fingerprint layer 30 has a good anti-fingerprint property.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A method for making a coated article, comprising:
   providing a substrate;
   forming a first anti-fingerprint layer on the substrate by vacuum sputtering, the first anti-fingerprint being an aluminum oxide layer;
   forming a second anti-fingerprint layer directly on the first anti-fingerprint layer by vacuum sputtering, the second anti-fingerprint layer being an aluminum-oxygen-nitrogen compound layer; and
   implanting one or more ion species selected from the group consisting of fluorine ion, boron ion, and nitrogen ion into a surface layer of the second anti-fingerprint layer by ion implantation process.

2. The method as claimed in claim 1, wherein vacuum sputtering the first anti-fingerprint layer uses aluminum targets applied with a power of about 2 kW to about 5 kW; uses oxygen at a flow rate of about 100 sccm to about 300 sccm as a reaction gas; uses argon at a flow rate of about 100 sccm to about 300 sccm as a sputtering gas; applies a bias voltage of about −70 V to about −180 V to the substrate; and vacuum sputtering the first anti-fingerprint layer is conducted under a temperature of about 50° C. to about 180° C.

3. The method as claimed in claim 2, wherein vacuum sputtering the first anti-fingerprint layer takes about 20 min to 60 min.

4. The method as claimed in claim 1, wherein vacuum sputtering the second anti-fingerprint layer uses aluminum targets applied with a power of about 2 kW to about 5 kW; uses oxygen and nitrogen as reaction gases, the oxygen has a flow rate of about 100 sccm to about 300 sccm, the nitrogen has a flow rate of about 50 sccm to 150 sccm; uses argon at a flow rate of about 100 sccm to about 300 sccm as a sputtering gas; applies a bias voltage of about −70 V to about −180 V to the substrate; vacuum sputtering the anti-fingerprint layer is at a temperature of about 50° C.-180° C.

5. The method as claimed in claim 4, wherein vacuum sputtering the second anti-fingerprint layer takes about 20 min to 60 min.

6. The method as claimed in claim 1, wherein implanting the ions species is under a pressure of about $1\times10^{-4}$ Pa; uses a plasma source to process a process gas to be ion beams by applying a RF source power of about 30 kV to about 100 kW; the process gas creates a working atmosphere from about 0.1 Pa to about 0.5 Pa in the plasma source; the ion beams have an intensity of about 1 mA to about 5 mA; the density of the ions implanted in the second anti-fingerprint layer may be about $1\times10^{16}$ ions/$cm^2$ to about $1\times10^{18}$ ions/$cm^2$.

7. The method as claimed in claim 6, wherein the process gas is one or more selected from the group consisting of $CF_4$, $B_2H_6$, and $N_2$.

8. The method as claimed in claim 1, further comprising a step of forming a metallic decorative layer on the substrate by vacuum sputtering deposition, before the step of forming the first anti-fingerprint layer.

\* \* \* \* \*